United States Patent [19]

Myer

[11] Patent Number: 5,012,490
[45] Date of Patent: Apr. 30, 1991

[54] VARYING BANDWIDTH DIGITAL SIGNAL DETECTOR

[75] Inventor: Robert E. Myer, Denville, N.J.

[73] Assignee: AT&T Bell Laboratories, Murray Hill, N.J.

[21] Appl. No.: 456,897

[22] Filed: Dec. 26, 1989

[51] Int. Cl.[5] .......................................... H04B 15/00
[52] U.S. Cl. ..................................... 375/58; 455/340; 375/103; 328/151
[58] Field of Search .................. 375/38, 58, 96, 103; 455/261, 263, 266, 344; 364/724.01, 724.11, 484; 328/151

[56] References Cited

U.S. PATENT DOCUMENTS

| | | | |
|---|---|---|---|
| 3,792,195 | 2/1974 | Wilson et al. | 455/226 |
| 3,904,968 | 9/1975 | Brinegar | 455/266 |
| 4,045,740 | 8/1977 | Baker | 455/266 |
| 4,087,750 | 5/1978 | Allen et al. | 455/226 |
| 4,189,755 | 2/1980 | Balbes et al. | 358/904 |
| 4,597,107 | 6/1986 | Rzady et al. | 364/484 |
| 4,601,045 | 7/1986 | Lubarsky | 375/58 |
| 4,792,993 | 12/1988 | Ma | 455/266 |
| 4,862,175 | 8/1989 | Biggs et al. | 455/226 |

Primary Examiner—Benedict V. Safourek
Assistant Examiner—Stephen Chin
Attorney, Agent, or Firm—A. G. Steinmetz

[57] ABSTRACT

A digital communication system has a plurality of channels with distinct carrier frequencies and overlapping bands. Each receiver includes a filter having a time varying bandwidth. The received signal includes at least one carrier modulated by an information signal having a plurality of levels and transitions between the levels at predetermined intervals and components due to other channels. The receiver is synchronized to a selected one of the carriers. The received signal is translated to baseband and applied to the time varying filter which is set to a first bandwidth at the information signal transitions and reduced in the intervals between transitions. The first filter bandwidth accommodates the information signal transitions. Reducing the bandwidth between transitions limits interference components in the time varying filter output when the information signal level is sampled. The technique may be applied to various modulation schemes.

13 Claims, 5 Drawing Sheets

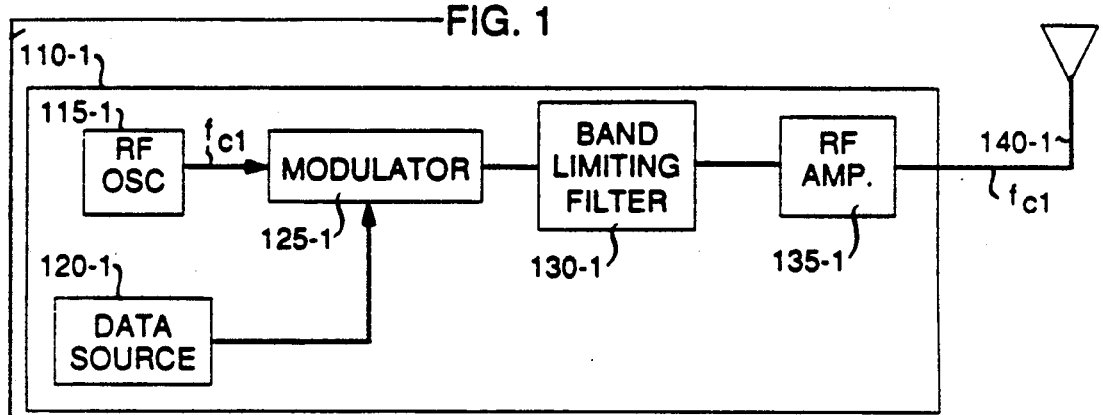
FIG. 1
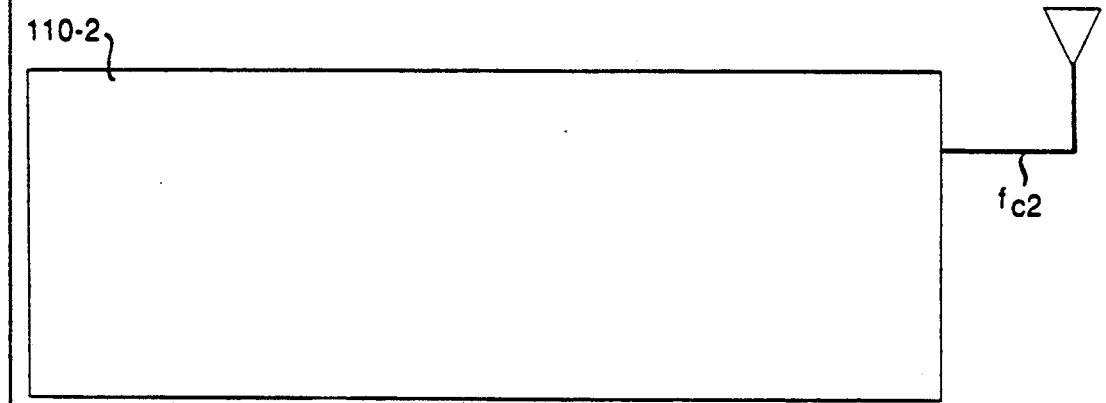
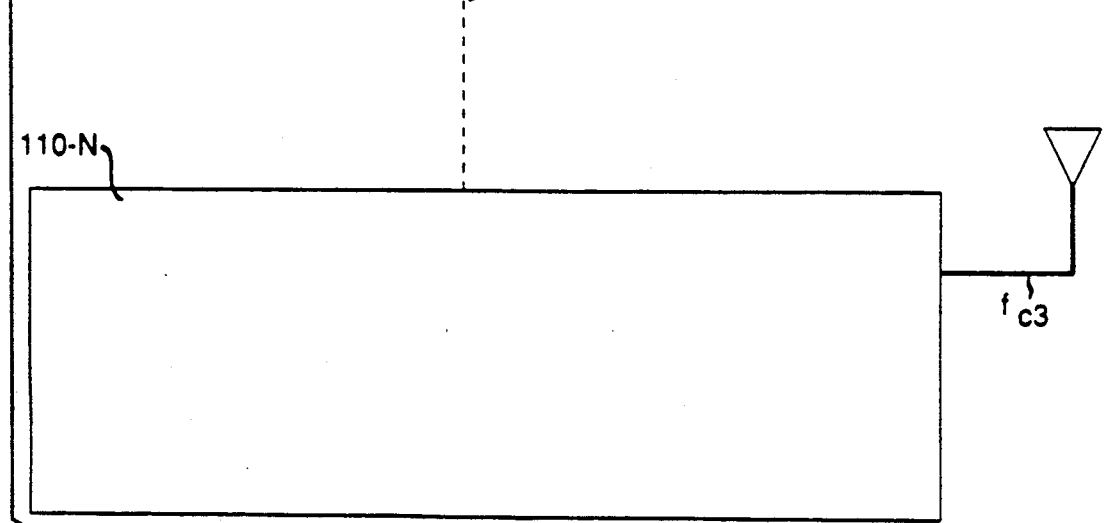

VARYING BANDWIDTH DIGITAL SIGNAL DETECTOR

FIELD OF THE INVENTION

The invention relates to radio frequency communication and, more particularly, to digital signal transmitter and receiver arrangements.

BACKGROUND OF THE INVENTION

In RF digital communication systems, the bandwidth of a channel is generally preset in accordance with the permitted frequency spectrum rather than chosen on the basis of the data characteristics. Once the channel bandwidth is known, the data rate and the shape of the digital signal may be selected so that the permitted frequency spectrum is not exceeded. It has also been necessary to avoid nonlinearity in transmission which could cause the RF spectrum of the signal to spill over the assigned channel bandwidth.

Techniques have been devised to optimize signal reception by controlling the bandwidth of a receiver. In some arrangements, the bandwidth is varied in accordance with the signal to noise ratio. U.S. Pat. No. 4,189,755 issued to M. S. Balbes et al, Feb. 19, 1980, discloses a television receiver threshold extension system in which the received video signal and noise are sampled and signal representative of the signal to noise ratio is formed. When the received signal drops to an objectionable level, the bandwidth of the receiver is narrowed to reduce the signal noise.

U.S. Pat. No. 4,792,993 issued to John Y. Ma, Dec. 20, 1988, discloses a receiver system having automatic bandwidth adjustment for signals with varying bandwidths. A bandwidth detection circuit indicative of the bandwidth generates a filter bandwidth control signal which selects one of a plurality of bandpass filters to accommodate the incoming signal.

Some arrangements vary receiver bandwidth in accordance with amplitude of the received signal. U.S. Pat. No. 3,904,968 issued to B. M. Brinegar, Sept. 9, 1975, for example, discloses a signal sensitive switching circuit that allow normal operation of a receiver when the received signal is greater than a predetermined amplitude and inserts a narrow band filter to reduce the effects of noise when the received signal is less than the predetermined amplitude.

With respect to data signals, U.S. Pat. No. 4,045,740 issued to K. L. Baker, Aug. 30, 1977, discloses a method of optimizing the bandwidth of a radio receiver to accommodate signals having widely varying data rates wherein the optimum intermediate frequency for a given data rate is determined and a filter having a continuously tunable bandwidth is adjusted accordingly.

As is well known in the art, signal detection for data occurs between transitions of the demodulated data waveform. The receiver bandwidth, however, is generally set to accommodate the wide frequency spectrum of the transitions and may be varied as aforementioned in accordance with the amplitude or signal to noise ratio of the received signal. As a result of the wide bandwidth to accommodate transitions, the noise remains at a high at the detection instants. This noise due to transition determined bandwidth results in lower detection accuracy. It is an object of the invention to provide an improved digital signal transmission arrangement having more accurate detection without limiting the data transition rate.

BRIEF SUMMARY OF THE INVENTION

The foregoing object is achieved by recognizing that a wide bandwidth is required only for data transitions but a narrow bandwidth is sufficient to distinguish between signal levels at detection instants. A wide band data signal is transmitted to accommodate fast transitions. Data detection is improved by providing a wide bandwidth for received data transitions and a narrow bandwidth at detection instants to minimize the effects of noise and other interference.

The invention is directed to a communication system in which at least one carrier modulated by a first information signal is received. The first information signal has a plurality of levels and transitions between the levels occurring at predetermined intervals. A demodulated signal corresponding to the first information signal is formed. The levels of the demodulated signal between transitions are detected at a narrow bandwidth by limiting the demodulated signal to a first bandwidth at the transition instants of the first information signal and to a second narrower bandwidth between the transitions and sampling the baseband signal from the bandwidth limiting means at the narrower bandwidth.

DESCRIPTION OF THE DRAWING

FIG. 1 is a block diagram of a plurality of data transmitters in a communication system illustrative of the invention;

DETAILED DESCRIPTION

Referring to FIG. 1, there is shown a set of data transmitters 110—1, 110—2, ..., 110—N in a communication system illustrative of the invention. Data transmitter 110—1 comprises RF oscillator 115—1, data source 120—1, modulator 125—1, band limiting filter 130—1, RF amplifier 135—1 and antenna 140—1. RF oscillator 115—1 and data source 120—1 have their outputs connected to the oscillator and data inputs of modulator 125—1. The output of modulator 125—1 is connected through band limiting filter 130—1 to the input of RF amplifier 135—1 and the RF amplifier output is in turn connected to transmitting antenna 140—1.

In FIG. 1, RF oscillator 115—1 generates a carrier signal at a predetermined frequency $f_{c1}$. Data source 120—1 supplies data signals having one of two or more levels between successive transitions determined by a data clock therein. Modulator 125—1 combines the data signals from data source 120—1 with the carrier frequency signal $f_{c1}$ to form a data modulated signal having a predetermined bandwidth centered at the carrier frequency. Modulator 125—1 may implement any of the well known modulation techniques such as amplitude, frequency or phase modulation. Data transmitters 110—2 through 110—N are substantially similar to data transmitter 110—1 except that the carrier frequency of each of transmitters 110—1, 110—2, . . . , 110—N is different.

Figure 2:
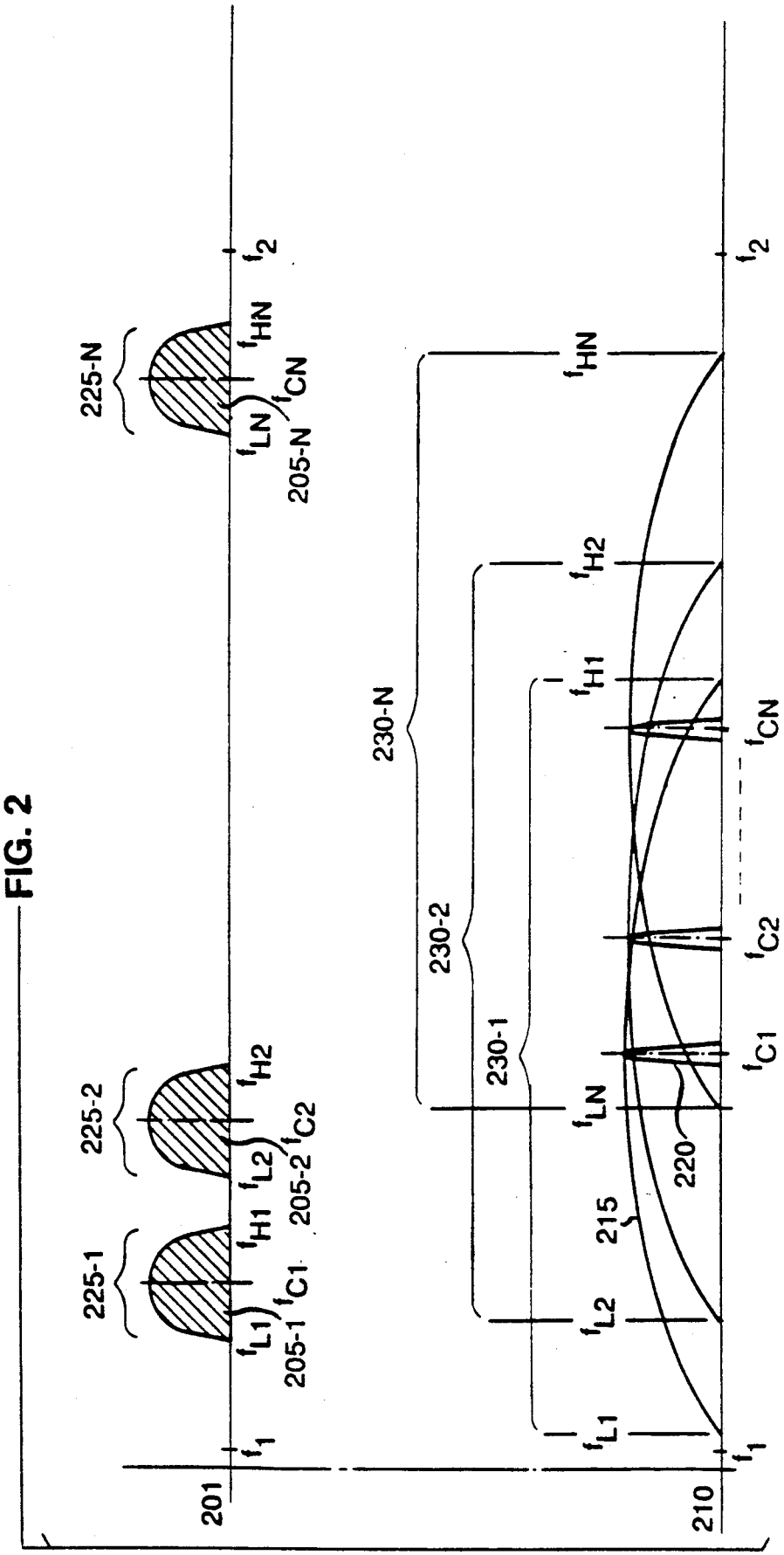
FIG. 2 shows waveforms illustrating the frequency bands assigned to the transmitters of FIG. 1.

In priorly known communication systems using carrier frequency assignment, each data transmitter is assigned a carrier frequency and the band limiting filter is set so that the modulated signals from the different data transmitters do not overlap. FIG. 2 illustrates carrier frequency and channel band assignments for the transmitter arrangement of FIG. 1. Referring to FIG. 2, waveform 201 shows a frequency spectrum arrangement in which channel bands are separated to avoid interference between channels.

Transmitter 110—1 of FIG. 1 uses channel 205—1 having a center frequency of $f_{c1}$. Band limiting filter 130—1 is set to limit the band between lower frequency limit $f_{L1}$ and high frequency limit $f_{H1}$ as indicated by bracket 225—1. Transmitter 110—2 occupies channel 205—2 with a center frequency of $f_{c2}$, low limit frequency $f_{L2}$ and high frequency limit $f_{H2}$ as indicated by bracket 225—2 and transmitter 110—N occupies channel 205—N with a center frequency of $f_{cN}$, low limit frequency $f_{LN}$ and high limit frequency $f_{HN}$ as indicated by bracket 225—N. The transmitter channels are non-overlapping and generally are separated by guard bands.

Figure 3:
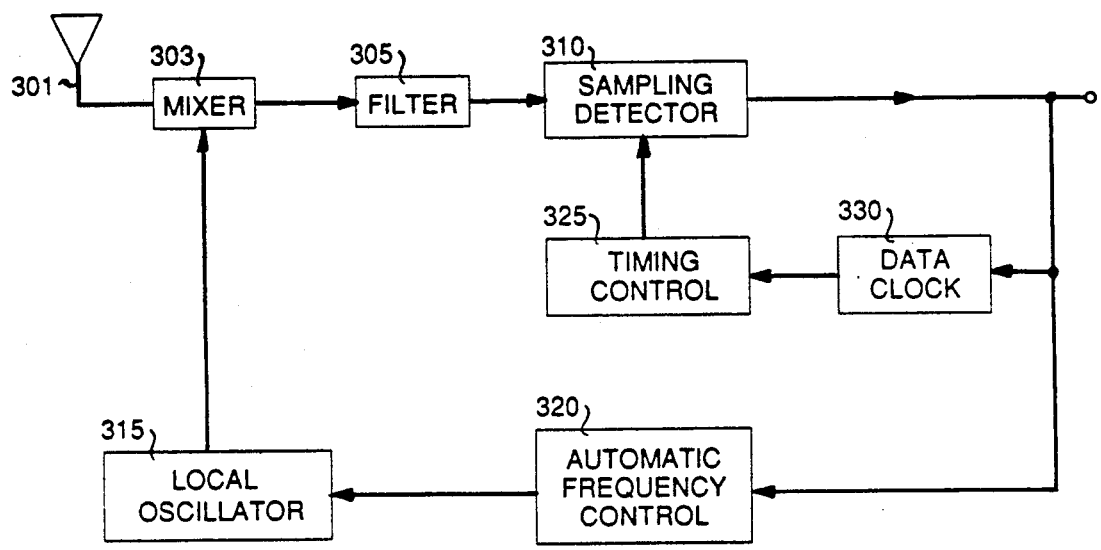
FIG. 3 is a block diagram of a data receiver according to the prior art.

FIG. 3 shows a priorly known data receiver 300 that may be used to recover the data signals from channels arranged according to waveform 201 of FIG. 2. Assume for purpose of illustration that receiver 300 is adapted to detect phase modulated signals. The data receiver of FIG. 3 comprises antenna 301, mixer 303 adapted to convert received RF signals to baseband, local oscillator 315, band limiting filter 305, data signal sampling detector 310, automatic frequency control 320, data clock 330, and timing control 325. Referring to FIG. 3, a signal having a prescribed carrier frequency, e.g., $f_{c1}$, is received by antenna 301 and sent to mixer 303. The output of local oscillator 315 is combined with the received signal in mixer 303 to translate the received signal to baseband. Filter 305 is of the low pass type having a fixed bandpass that removes high frequency components of the baseband signal applied thereto. The filter output is a signal representative of the phase variations corresponding to the data signal component of the received signal. The phase varying representative signal is applied to sampling detector 310 wherein it is periodically sampled. Data signal sampling instants are controlled by the feedback loop including data clock 330 and timing control 325 and the frequency of the local oscillator output signal is controlled by automatic frequency control 320 as is well known in the art.

Referring again to FIG. 2, the bandwidth of each channel of waveform 201 is fixed. Therefore the bandwidth of filter 305 is set to adequately pass the data signals and to limit noise. Waveform 210 illustrates the frequency assignments of channel arrangement in accordance with the invention. Each channel has a center frequency that is separated from the center frequencies of the other channels. The bands occupied by the channels overlap. Transmitter 110—1 of FIG. 1 has its carrier frequency $f_{c1}$ separated from the carrier frequency $f_{c2}$ of transmitter 110—2 and from the carrier frequency $f_{cN}$ of transmitter 110—N as indicated in waveform 210. The carrier frequency separation may be substantially smaller than in waveform 201. As indicated in waveform 210, the bandwidth of a channel varies over a data interval. At the transition times, the bandwidth for each channel is wide and covers a significant portion of the total band for the channels. Between transition times, however, the data signal is at a single level and the bandwidth is narrow. For example, the band for the signal of carrier $f_{c1}$ shown as curve 215 extends from $F_{L1}$ to $F_{H1}$ at transition times as indicated by bracket 230—1 but is very narrow (curve 220) around carrier frequency $f_{c1}$ in the level portions of the data signal.

The bandwidth of each channel in waveform 210 at the transition times is much wider than the channel bandwidths in waveform 201 so that the channel bands at transition times overlap. The band for transmitter 110—1 extends from low frequency limit $f_{L1}$ to high frequency limit $f_{H1}$ and overlaps the band for transmitter 110—2 which extends from low frequency limit $f_{L2}$ to high frequency limit $f_{H2}$. Similarly, the band for transmitter 110—N extends from low frequency limit $f_{LN}$ to high frequency limit $f_{HN}$ as indicated by bracket 230—N. The wide overlapping channel bandwidths occurring only at transition times of the modulating digital signals accommodate much faster data transitions. The overlap of other channels results in signal interference that prevents successful recovery of the data in the prior art receiver 300. The bandwidth for a channel in the level portions of the digital signal, however, is narrow. According to the invention, a receiver is synchronized to a particular carrier frequency, e.g., $f_{c1}$. The received signal is demodulated and the demodulated signal is passed through a time varying filter that is synchronized to the data signal modulating the particular carrier. At transition times of the data signal modulating the particular carrier, the bandwidth of the time varying filter is set to accommodate the transition occurring thereat. The bandwidth is reduced between transition times of the data signal modulating the particular carrier so that noise and interference is minimized and the level can be accurately sampled.

Figure 4:
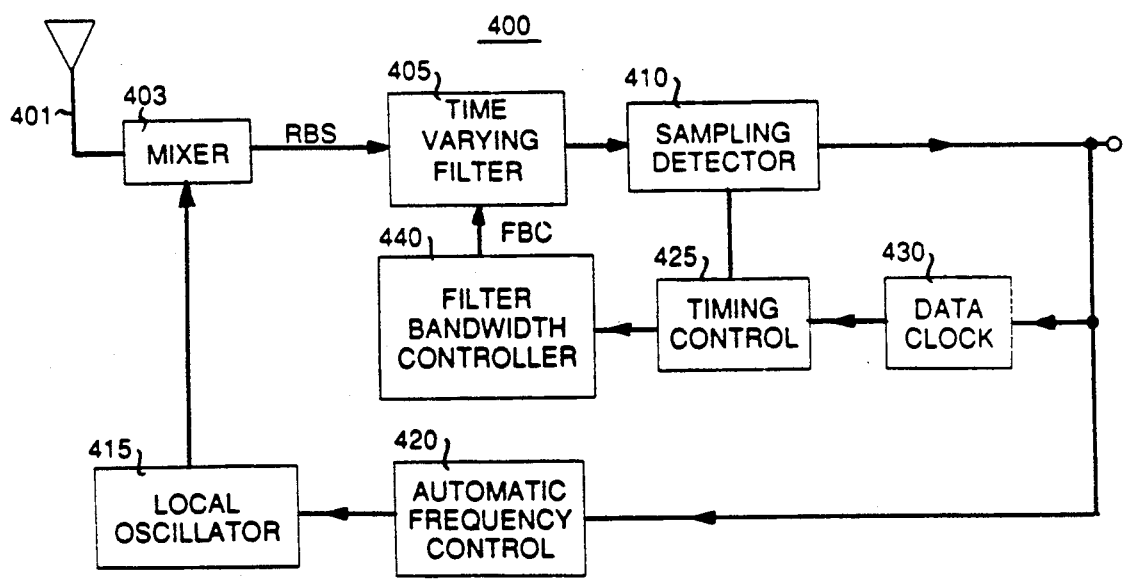
FIG. 4 is a block diagram of a data receiver illustrative of the invention.
Figure 5:
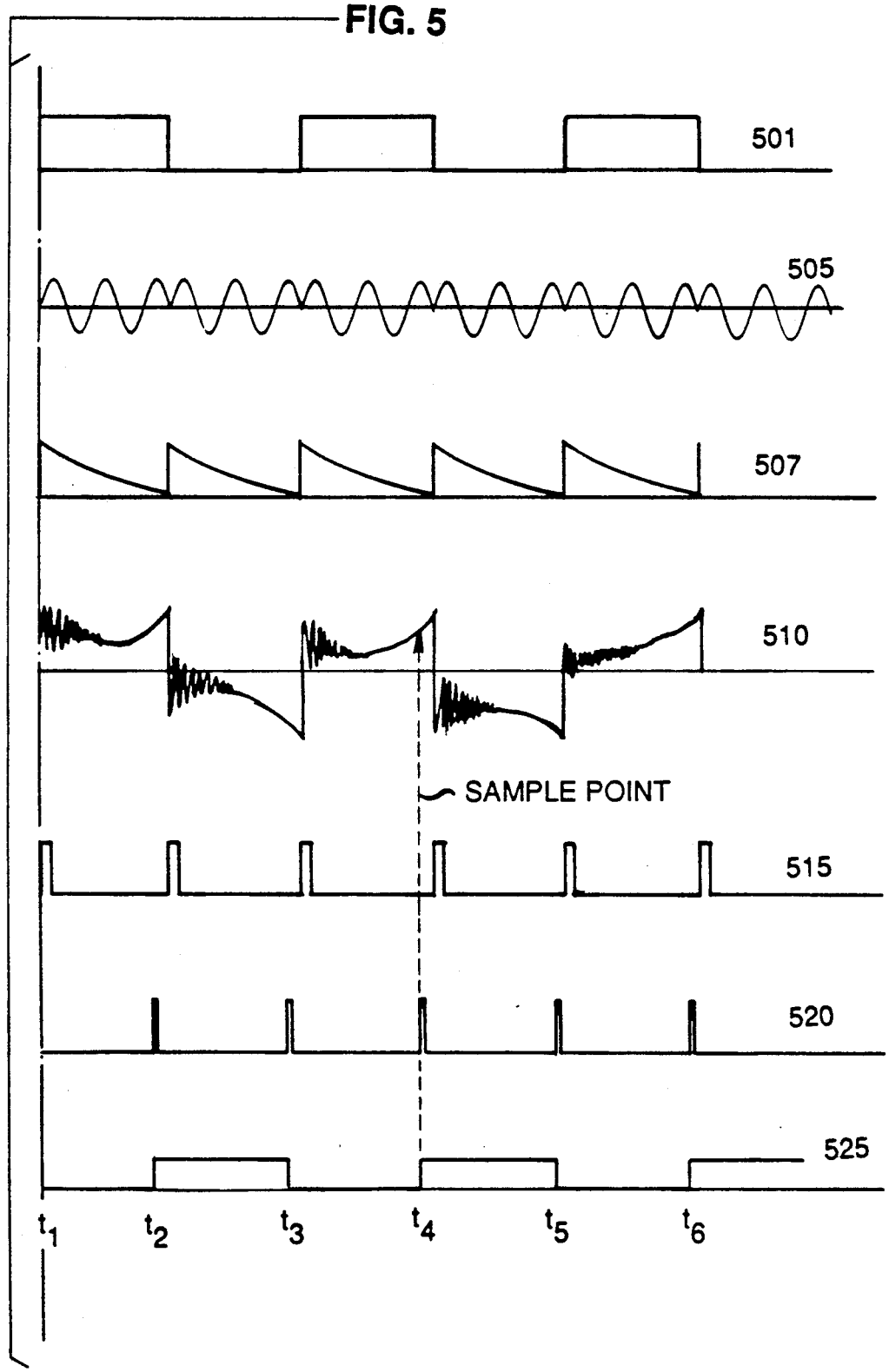
FIG. 5 shows waveforms that illustrate the operation of the data receiver of FIG. 4.

FIG. 4 shows a data receiver embodiment 400 of the invention which is adapted to accurately recover data transmitted in an overlapping channel arrangement such as illustrated in waveform 210. FIG. 5 shows waveforms illustrating the operation of receiver 400. Data receiver 400 comprises antenna 401, mixer 403, time varying filter 405, sampling detector 410, local oscillator 415, automatic frequency control 420, data clock 430, timing control 425 and filter bandwidth control 440. The sample detector 410, the data clock 430, timing control 425 and automatic frequency control 420 may be analog or digital circuits well known in the art. If such circuits are digital, sample detector 410 includes an analog to digital converter at its input and timing control 425 and automatic frequency control 420 include digital to analog converters at their outputs.

Referring to FIG. 4, a signal including a phase modulated component having a prescribed carrier frequency, e.g., $f_{c1}$, is received by antenna 401. Waveform 501 of FIG. 5 illustrates a data signal while waveform 505 shows a phase modulated carrier modulated by the data signal of waveform 501. Local oscillator 415 generates a local $f_{c1}$ carrier so that phase modulated component for the $f_{c1}$ carrier is translated to baseband in mixer 403. The output of mixer 403 has a component representative of the phase of the data signal modulating the $f_{c1}$ carrier but includes many other components related to wide band transmissions from other sources. Components other than the prescribed phase modulated component constitute interfering noise.

Time varying filter 405 receives the baseband signal from mixer 403. After setting of the local oscillator frequency and synchronization of the data signals as will be described, the bandwidth of filter 405 is varied during each data signal period. At data transition times, the bandwidth of filter 405 is extended to accommodate the high frequency components of the transition. The bandwidth of filter 405 is narrowed between transition times to limit the noise in the signal from mixer 403. Filter 405 may comprise a switched capacitor low pass filter having controllable Q and controllable bandwidth. The time variation in Q and bandwidth may be achieved by altering the switched capacitor clock frequency or by modifying the values of switched capacitor elements as is well known in the art.

Waveform 507 shows an exponentially decreasing signal applied to the control input of filter 405 from filter bandwidth control 440. In each data signal period, the control signal decreases from a value that causes the filter to pass the entire band of the received signal having the $f_{c1}$ carrier to a value that passes only a narrow portion of the band centered at carrier frequency $f_{c1}$. At each transition time, e.g., $t_1$, waveform 507 is high and filter 405 is set to a wide bandwidth so that it passes the data signal transition without distortion. From time $t_1$ until the next transition time $t_2$, the control signal in waveform 507 decreases. As a result, the bandwidth of filter 405 at time $t_1$ is adequate for the data transition but also passes components of the received signal related to other transmissions of the communication system and noise. The bandwidth just before time $t_2$ is narrow so that the components due to other transmissions and noise are removed by filter 405. It is to be understood that other waveshapes such as square or linearly decreasing waveforms may be used to optimize the time varying filter action to transfer digital signal transitions without distortion and to minimize noise and interference at sampling instants during the level portions of the digital signal.

Waveform 510 illustrates the output of time varying filter 405 for a sequence of data signal periods. The filter output signal in waveform 510 at the beginning of each data period may assume any value since the received signal has many interfering components and the bandwidth of the filter is wide so that all such components pass through the filter. At transition times $t_1$ and $t_4$, the value of waveform 510 is relatively high while the value of the waveform is relatively low at transition times $t_2$, $t_3$, $t_5$ and $t_6$. The state of waveform 510 at transition times depends on the noize and interference present in the demodulated signal applied to filter 405. Since the bandwidth of filter 405 is narrow just before a transition time, only a small portion of the data signal band for carrier frequency $f_{c1}$ is passed. Consequently, the filter output represents the value of the $f_{c1}$ data signal and there is little noise present.

Figure 6:
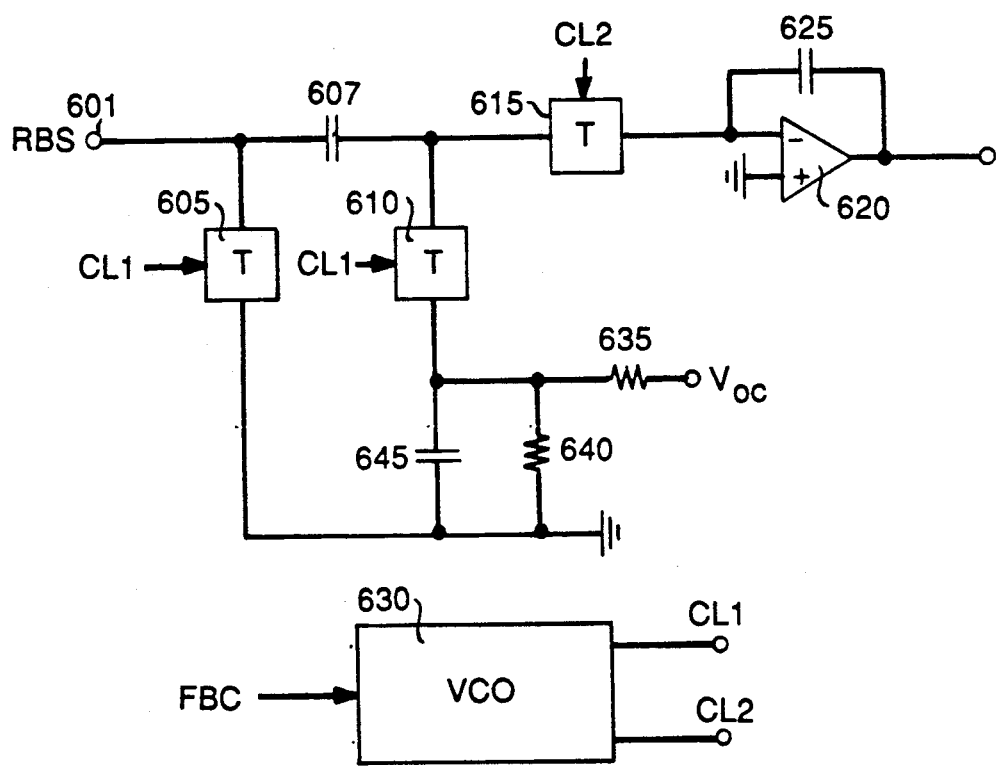
FIG. 6 shows a block diagram of a switched capacitor filter that may be used as the time varying filter in the circuit of FIG. 3.

Time varying filter 405 in FIG. 4 may comprise the switched capacitor filter arrangement shown in FIG. 6. Referring to FIG. 6, the switched capacitor filter comprises input terminal 601, transmission gates 605, 610 and 615, switched capacitor 607, amplifier 620, integrator capacitor 625 and voltage controlled oscillator 630. Received baseband signal RBS from mixer 403 in FIG. 4 is applied to input terminal 601. As is well known in the art, switched capacitor 607 and transmission gates 605, 610 and 615 form a resistive charging source for integrator capacitor 625. This resistive charging source is varied by changing the frequency of the clock outputs of voltage controlled oscillator 630. As a result, the pass band of the filter is a function of the clock frequency.

Voltage controlled oscillator 630 provides the clock signal CL1 for transmission gates 605 and 610 and the clock signal CL2 for transmission gate 615. Clocks CL1 and CL2 are non-overlapping square waves occurring at the frequency determined by voltage controlled oscillator 630. When clock CL1 turns transmission gates 605 and 610 on, switched capacitor 607 is charged to the voltage from the bias source including resistors 635 and 640 and capacitor 645. When clock CL2 turns on the signal RBS is transferred through capacitor 607 and transmission gate 615 to the input of integrating operational amplifier 620. The minimum clock frequency is selected to be much higher than the frequency components of the desired baseband input to the filter.

As is well known in the art, the frequency of oscillator 630 is determined by the control voltage signal FBC applied to its input. Signal FBC is shown in waveform 507 of FIG. 5. During each data signal period, e.g., between times $t_1$ and $t_2$, the control voltage decreases from a high value to a low value and the clock signal frequency in FIG. 6 decreases from a high value to a low value. At time $t_1$, the resistance exhibited by switched capacitor 607 is relatively small and increases to a maximum just prior to time $t_2$. Consequently, the bandwidth of the switched capacitor filter of FIG. 6 decreases from a maximum value at transition time $t_1$ to a minimum just prior to transition time $t_2$.

Sampling detector 410 receives the output of time varying filter 405 and is operative to sample the each data signal therefrom at time determined by data clock 430 and timing control 425. Waveform 515 of FIG. 5 illustrates the pulses from data clock 430 and waveform 520 illustrates the sampling pulses from timing control 425. These sampling pulses are set to occur when the bandwidth of time varying filter 405 is narrow so that the effect of interference components and noise is minimized. In FIG. 5, the sampling pulses in waveform 520 occur just prior to the transition times defined by the data clock pulses of waveform 515. Waveform 525 illustrates the output of sampling detector 410. The data detector output signal in waveform 525 between times $t_2$ and $t_3$ corresponds to the positive polarity of the level of the data signal of waveform 501 in the interval between times $t_1$ and $t_2$ sampled just prior to time $t_2$. The sample detector outputs for the data signal periods of waveform 501 between times $t_3$ and $t_4$ and times $t_5$ and $t_6$ correspond to the positive levels of the data signals in those intervals while the sample detector outputs in waveform 525 for the data signal periods of waveform 501 between times $t_2$ and $t_3$ and times $t_4$ and $t_5$ correspond to the negative levels of the data signals of waveform 501 in those intervals. Waveform 525 is therefore delayed one data signal period from waveform 501.

Synchronization of the data receiver to the received data signal may be performed using one of the methods well known in the art. In the data receiver of FIG. 4, local oscillator is initially set to the received carrier signal, e.g., $f_{c1}$ and data clock 430 is initially set to the prescribed data signal interval. The data signal sequence in the received signal includes a prescribed preamble pattern. The outputs of sampling detector 410 are compared with the expected output for the prescribed preamble pattern in automatic frequency control 420 and data clock 430 in a manner well known in the art. Differences from the comparisons are then used to generate a carrier correction signal in automatic frequency control 430 and a data clock correction signal in data clock 430.

The invention has been described with reference to one embodiment illustrative thereof. It is apparent, however, that various modifications and changes may be made by one skilled in the art without departing from the spirit or scope of the invention.

I claim:

1. A communication receiver comprising:
   means for receiving a modulated RF signal including at least one carrier signal modulated by a first information signal, the first information signal having a plurality of levels and transitions between the levels occurring at predetermined intervals,
   means responsive to the received modulated RF signal for forming a demodulated signal including a component corresponding to the first information signal, and
   means for detecting the levels of the demodulated signal between the transitions of the first information signal,
   the detecting means includes:
   means for limiting the demodulated signal to a first bandwidth at the transition instants of the first information signal and to a second narrower bandwidth between the transitions of the first information signal, and
   means for sampling the demodulated signal from the bandwidth limiting means during the second narrower bandwidth of the demodulated signal.

2. A communication receiver according to claim 1 wherein the demodulated signal limiting means comprises:
   filter means having a controllable variable bandwidth, and
   means for adjusting the bandwidth of the filter means to the first bandwidth at transitions of the first information signal and to the second narrower bandwidth between the transitions of the first information signal.

3. A communication receiver according to claim 2 wherein:
   the filter means having a controllable variable bandwidth comprises a filter including at least one resistive charging source for determining the bandpass of the filter, and
   the filter bandwidth adjusting means comprises means for adjusting the resistive charging source to a first value at the transitions of the first information signal and to a second value between transition of the first information signal.

4. A communication receiver according to claim 3 further including;
   the resistive charging source comprises a switched capacitor element and means for clocking the switched capacitor element, and
   the means for adjusting the resistive charging source comprises means for varying the frequency of the switched capacitor element clocking means to adjust the resistive charging source.

5. A communication receiver according to claim 4 further comprising:
   means responsive to each transition of the first information signal for producing a frequency control signal having an initial value at each transition and decreasing to a second value just prior to the next transition of the first information signal, and
   the means for clocking the switched capacitor element comprises a voltage controlled oscillator responsive to the frequency control signal for varying the frequency of the voltage controlled oscillator.

6. A communication receiver according to claims 1, 2, 3, 4 or 5 wherein the demodulated signal is a baseband signal.

7. A communication receiver comprising:
   means for receiving a plurality of signals each having a distinct carrier modulated by an information signal including a signal having a first carrier signal modulated by a first information signal, each information signal having a plurality of levels and transitions between the levels occurring at predetermined intervals,
   means responsive to the received signal for demodulating the received signal to form a baseband signal including a component corresponding to the first information signal,
   means for detecting the levels of the baseband signal between the transitions of the first information signal,
   means responsive to the detected levels of the baseband signal for synchronizing the demodulating means to the first carrier frequency, and
   means responsive to the detected levels of the baseband signal for synchronizing the detecting means to the transitions of the first information signal,
   the detecting means including:
   means for limiting the baseband signal from the demodulating means to a first bandwidth at the transition instants of the first information signal and to a second narrower bandwidth between the transitions of the first information signal, and
   means for sampling the baseband signal from the bandwidth limiting means during the second narrower bandwidth of the baseband signal.

8. A communication system for exchanging information signals over a plurality of channels comprising:
   a plurality of transmitters each responsive to an information signal having a plurality of levels and transitions between the levels occurring at predetermined intervals for generating a prescribed band signal having a distinct carrier modulated by the information signal, the prescribed bands forming a set of overlapping frequency band channels, and
   at least one receiver comprising:
   means for receiving the set of overlapping frequency band channel signals including a signal having a first carrier signal modulated by a first information signal,
   means responsive to the received signals for forming a demodulated signal including a component corresponding to the first information signal,
   means for detecting the levels of the demodulated signal between the transitions of the first information signal,
   means responsive to the detected levels of the demodulated signal for synchronizing the demodulated signal forming means to the first carrier frequency, and
   means responsive to the detected levels of the demodulated signal for synchronizing the detecting means to the transitions of the first information signal,
   the detecting means including:
   means for restricting the demodulated signal to a first bandwidth at the transition instants of the first information signal and to a second narrower bandwidth between the transitions of the first information signal, and means for sampling the demodulated signal from the bandwidth limiting means during the second narrower bandwidth of the demodulated signal to form a signal corresponding to the first information signal.

9. A communication system for exchanging information signals over a plurality of channels according to claim 8 wherein the demodulated signal restricting means comprises:

filter means having a controllable variable bandwidth, and means for adjusting the bandwidth of the filter means to the first bandwidth at transitions of the first information signal and to the second narrower bandwidth between the transition of the first information signal.

10. A communication system for exchanging information signals over a plurality of channels according to claim 9 wherein:

the filter means having a controllable variable bandwidth comprises a filter including at least one resistive charging source for determining the time constant of the filter, and the filter bandwidth adjusting means comprises means for adjusting the resistive charging source to a first value at the transitions of the first information signal and to a second value between the transitions of the first information signal.

11. A communication system for exchanging information signals over a plurality of channels according to claim 10 wherein:

the resistive charging source comprises a switched capacitor element and means for clocking the switched capacitor element, and the means for adjusting the resistive charging source comprises means for varying the frequency of the switched capacitor element clocking means to adjust the resistive charging source.

12. A communication system for exchanging information signals over a plurality of channels according to claim 11 further comprising means responsive to each transition of the first information signal for producing a frequency control signal having an initial value at each transition and decreasing to a second value just prior to the next transition of the first information signal, and the means for varying the frequency of clocking the switched capacitor element comprises a voltage controlled oscillator responsive to the frequency control signal for varying the frequency thereof.

13. A communication system for exchanging information signals over a plurality of channels according to claims 8, 9, 10, 11 or 12 wherein the means for forming the demodulated signal comprises means for forming a baseband signal.

* * * * *